United States Patent
Ichinose

(10) Patent No.: US 11,309,325 B2
(45) Date of Patent: Apr. 19, 2022

(54) NONVOLATILE SEMICONDUCTOR MEMORY DEVICE AND METHOD OF MANUFACTURING THE SAME

(71) Applicant: KIOXIA CORPORATION, Minato-ku (JP)

(72) Inventor: Daigo Ichinose, Nagoya (JP)

(73) Assignee: KIOXIA CORPORATION, Minato-ku (JP)

( * ) Notice: Subject to any disclaimer, the term of this patent is extended or adjusted under 35 U.S.C. 154(b) by 0 days.

(21) Appl. No.: 16/941,106

(22) Filed: Jul. 28, 2020

(65) Prior Publication Data

US 2020/0357808 A1    Nov. 12, 2020

Related U.S. Application Data

(63) Continuation of application No. 14/849,772, filed on Sep. 10, 2015, now abandoned.

(60) Provisional application No. 62/132,254, filed on Mar. 12, 2015.

(51) Int. Cl.

| | |
|---|---|
| *H01L 29/792* | (2006.01) |
| *H01L 27/1157* | (2017.01) |
| *H01L 27/11582* | (2017.01) |
| *H01L 27/11575* | (2017.01) |
| *G11C 16/04* | (2006.01) |

(52) U.S. Cl.
CPC .... *H01L 27/1157* (2013.01); *H01L 27/11575* (2013.01); *H01L 27/11582* (2013.01); *G11C 16/0483* (2013.01); *G11C 2213/75* (2013.01)

(58) Field of Classification Search
CPC .......... H01L 27/11565; H01L 27/1157; H01L 27/11575; H01L 27/11582; H01L 27/11573
See application file for complete search history.

(56) References Cited

U.S. PATENT DOCUMENTS

| | | |
|---|---|---|
| 7,799,672 B2 | 9/2010 | Hashimoto et al. |
| 7,847,334 B2 | 12/2010 | Katsumata |
| 7,927,926 B2 | 4/2011 | Katsumata et al. |
| 8,178,917 B2 | 5/2012 | Tanaka |

(Continued)

FOREIGN PATENT DOCUMENTS

| | | |
|---|---|---|
| JP | 2010-192646 | 9/2010 |
| JP | 4691124 | 6/2011 |
| JP | 2012-151187 | 8/2012 |

*Primary Examiner* — Mary A Wilczewski
*Assistant Examiner* — Tsz K Chiu
(74) *Attorney, Agent, or Firm* — Oblon, McClelland, Maier & Neustadt, L.L.P.

(57) ABSTRACT

One embodiment includes: a substrate; a memory cell array that extends in a direction vertical to the substrate and includes a memory string having a plurality of series-coupled memory cells, and a selection transistor coupled to one end of the memory string; a wiring portion that includes a plurality of first conducting layers and a plurality of interlayer insulating films, the first conducting layers functioning as gate electrodes of the memory cell and the selection transistor, the interlayer insulating film being positioned between the first conducting layers in above and below directions; and a second conducting layer arranged on end portions of the plurality of first conducting layers of the selection transistor. The first conducting layers are electrically coupled in common to the second conducting layer.

9 Claims, 14 Drawing Sheets

(56) References Cited

U.S. PATENT DOCUMENTS

| | | |
|---|---|---|
| 8,435,857 B2 | 5/2013 | Kiyotoshi |
| 8,592,890 B2 | 11/2013 | Watanabe |
| 8,728,889 B2 * | 5/2014 | Lee .................. H01L 21/76802 |
| | | 438/257 |
| 8,822,285 B2 * | 9/2014 | Hwang ............. H01L 27/11582 |
| | | 438/257 |
| 9,087,736 B1 | 7/2015 | Lue |
| 9,171,859 B2 * | 10/2015 | Oh .................... H01L 27/11578 |
| 9,230,904 B2 * | 1/2016 | Eun .................... H01L 21/32139 |
| 9,601,370 B2 | 3/2017 | Kato et al. |
| 10,312,138 B2 * | 6/2019 | Hyun ................ H01L 27/11575 |
| 2003/0095448 A1 | 5/2003 | Ichige |
| 2008/0175032 A1 | 7/2008 | Tanaka |
| 2008/0318379 A1 | 12/2008 | Higashitani |
| 2009/0073736 A1 | 3/2009 | Cho |
| 2011/0175157 A1 * | 7/2011 | Sekine .............. H01L 29/66833 |
| | | 257/324 |
| 2011/0309432 A1 * | 12/2011 | Ishihara ............ H01L 27/11582 |
| | | 257/324 |
| 2012/0300527 A1 | 11/2012 | Shim |
| 2013/0089974 A1 | 4/2013 | Lee et al. |
| 2014/0070302 A1 | 3/2014 | Yoo |
| 2014/0339621 A1 | 11/2014 | Simsek-Ege |
| 2016/0079185 A1 * | 3/2016 | Kato .................. H01L 23/5226 |
| | | 257/314 |

\* cited by examiner

NONVOLATILE SEMICONDUCTOR MEMORY DEVICE AND METHOD OF MANUFACTURING THE SAME

CROSS REFERENCE TO RELATED APPLICATION

This application is a continuation of U.S. application Ser. No. 14/849,772, filed Sep. 10, 2015, which is based upon and claims the benefit of priority from U.S. Provisional Patent Application No. 62/132,254, filed on Mar. 12, 2015, the entire contents of which are incorporated herein by reference.

FIELD

Embodiments described herein relate generally to a nonvolatile semiconductor memory device and a method of manufacturing the nonvolatile semiconductor memory device.

BACKGROUND

Recently, in the field of NAND-type flash memories, attention has been focused on a laminated-type (three-dimensional) NAND-type flash memory as a device that can achieve high integration without being restricted by the limit of resolution of the lithography technology. This type of three-dimensional NAND-type flash memory includes a laminated body and a semiconductor layer. In the laminated body, a plurality of conductive films and interlayer insulating films are alternately laminated. The conductive film functions as word lines and selection gate lines. The semiconductor layer is formed to pass through these laminated films. This semiconductor layer functions as a body of a memory string. Between the semiconductor layer and the conductive film, a memory film that includes a charge storage film is formed.

In this three-dimensional NAND-type flash memory, the ON/OFF characteristics (selection characteristics) of selection transistors are important, and it is required to cause a flow of a sufficient cell current during selection and keep preferable characteristics of a selection gate electrode.

DETAILED DESCRIPTION

A nonvolatile semiconductor memory device according to embodiments described below includes a memory cell array and a wiring portion. The memory cell array includes: a memory string where a plurality of memory cells is series-coupled together; and a selection transistor coupled to one end of the memory string. The memory string is formed to extend to have the longitudinal direction in a first direction. The wiring portion is formed by alternately laminating a first conducting layer and an interlayer insulating film over a plurality of layers. The first conducting layers function as gate electrodes for the memory cells and the selection transistor. One of the selection transistors includes a plurality of the first conducting layers, and the plurality of the first conducting layers are electrically coupled in common to a second conducting layer that is a common contact formed on the sidewall of the wiring portion.

The following describes nonvolatile semiconductor memory devices according to embodiments in detail with reference to the accompanying drawings. Here, these embodiments are only examples. For example, the nonvolatile semiconductor memory device described below has a structure where a memory string extends in a straight line in the vertical direction with respect to a substrate. The similar structure is also applicable to the structure having a U shape where a memory string is folded to the opposite side in the middle. The respective drawings of the nonvolatile semiconductor memory devices used in the following embodiments are schematically illustrated. The thickness, the width, the ratio, and similar parameter of the layer are not necessarily identical to actual parameters.

Examples will be described below. This embodiment relates to a nonvolatile semiconductor memory device in a structure where a plurality of metal-oxide-nitride-oxide-semiconductor (MONOS) type memory cells (transistors) is disposed in a height direction. The MONOS type memory cell includes: a semiconductor film disposed in a columnar shape vertical to the substrate as a channel, and a gate electrode film disposed on the side surface of the semiconductor film via a charge storage layer. However, a similar structure is applicable to another type of charge storage film, for example, a semiconductor-oxide-nitride-oxide-semiconductor type (SONGS) memory cell or a floating-gate type memory cell.

First Embodiment

Figure 1:
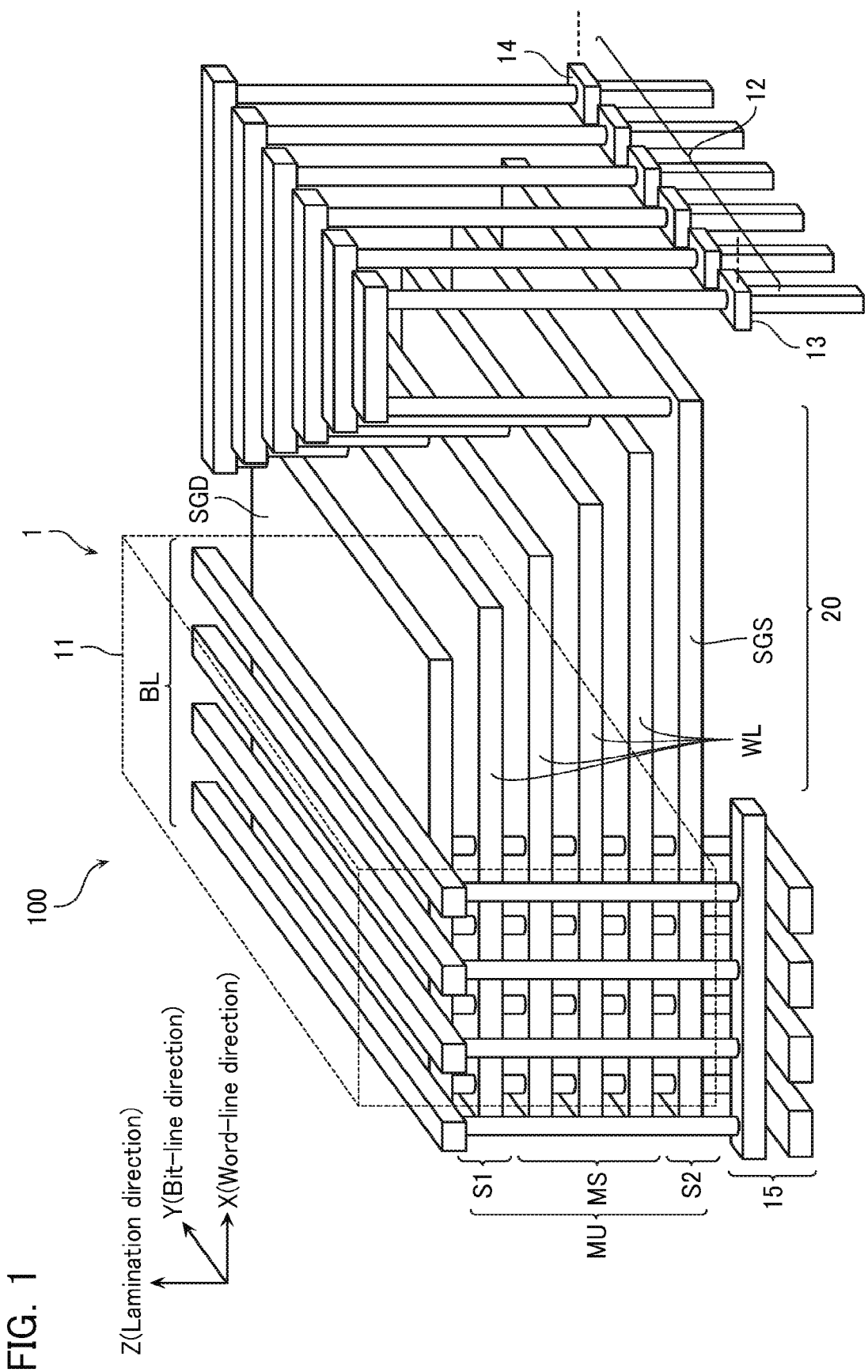
FIG. 1 is a perspective view schematically illustrating one example of the structure a nonvolatile semiconductor memory device 100 according to a first embodiment.

FIG. 1 is a perspective view schematically illustrating an exemplary structure of a nonvolatile semiconductor memory device 100 of a first embodiment. The nonvolatile semiconductor memory device 100 includes a memory cell array 11, word-line driving circuits 12, source-side selection-gate-line driving circuits 13, drain-side selection-gate-line driving circuits 14, a sense amplifier 15, word lines WL, source-side selection gate lines SGS, drain-side selection gate lines SGD, bit lines BL, a wiring portion 20, and similar portion.

The memory cell array 11 includes memory strings MS, drain-side selection transistors S1, and source-side selection transistors S2 on a semiconductor substrate (not illustrated in FIG. 1). The memory string MS is constituted such that a plurality of memory cells MC (memory transistors) are coupled together in series. The respective drain-side selection transistor S1 and source-side selection transistor S2 are coupled to both ends of the memory string MS. Here, the memory string MS, and the drain-side selection transistor S1 and the source-side selection transistor S2 coupled to both ends of the memory string MS are hereinafter referred to as a "NAND cell unit NU."

As described later, the memory cell MC has the structure, where a control gate electrode (word line) is disposed on the side surface of a columnar semiconductor film becomes a channel via a memory film including a charge storage layer. The drain-side selection transistor and the source-side selection transistor each have the structure where a selection gate electrode (selection gate line) is disposed on the side surface of a columnar semiconductor film via the memory film. For simplification of the illustration, FIG. 1 illustrates the case where four memory cells MC are disposed in one memory string MS as the example. Obviously, the number of the memory cells MC in one memory string MS is not limited to this.

The word line WL is coupled in common to the adjacent memory cells along the X direction (the word-line direction) in FIG. 1. The source-side selection gate line SGS is coupled in common to the adjacent source-side selection transistors S2 along the word-line direction. The drain-side selection gate line SGD is coupled in common to the adjacent drain-side selection transistor S1 along the word-line direction. Here, in the following description, the source-side selection gate line SGS and the drain-side selection gate line SGD are collectively referred to simply as "selection gate lines" in some cases. The drain-side selection transistor and the source-side selection transistor are collectively referred to simply as "selection transistors" in some cases. Here, in the memory cells MC in the memory string MS, one or a plurality of the memory cells MC close to the source-side selection gate line SGS and the drain-side selection gate line SGD might be treated as a dummy cell that is not used for data storage. Also in the example described as follows, a description will be given of the example where one dummy cell is disposed at each of both ends of the memory string MS. This, however, should not be construed in a limiting sense. Two or more dummy cells may be disposed or the dummy cell may be omitted.

Furthermore, the bit lines BL are disposed to extend having the longitudinal direction in the Y direction (the bit-line direction) intersecting with the X direction (the word-line direction), and are collocated at a predetermined pitch in the X direction. The bit line 111, is coupled to a plurality of the memory strings MS via the drain-side selection transistors S1. Source lines SL, which are omitted in FIG. 1, are disposed having the longitudinal direction, similarly, in the Y direction and coupled to the memory strings MS via the source-side selection transistors S2.

The word-line driving circuit 12 is a circuit that controls the voltage to be applied to the word line WL. The source-side selection-gate-line driving circuit 13 is a circuit that controls the voltage to be applied to the source-side selection gate line SGS. The drain-side selection-gate-line driving circuit 14 is a circuit that controls the voltage to be applied to the drain-side selection gate line SGD. The sense amplifier 15 is a circuit for amplifying a signal (voltage) read out from a selected memory cell to the bit line BL.

The wiring portion 20 is a wiring portion for coupling the word lines WL and the selection gate lines SGD and SGS to the contacts. The word lines WL, the selection gate lines SGS and SGD have a structure processed in a staircase pattern such that the respective upper portions can independently be coupled to the contacts.

Figure 2:
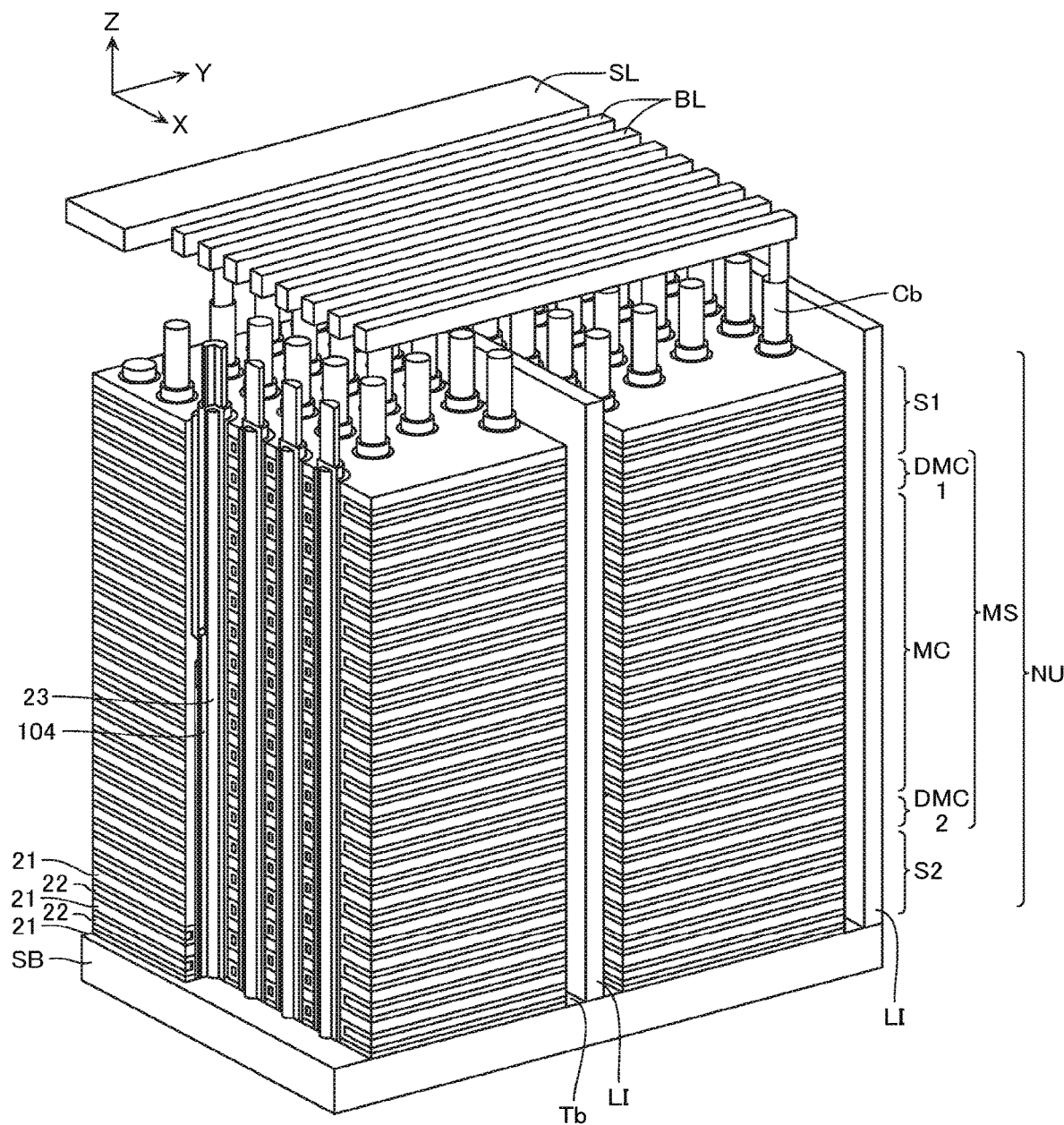
FIG. 2 is a perspective view illustrating the structure of a part of memory cell arrays 11.
Figure 3:
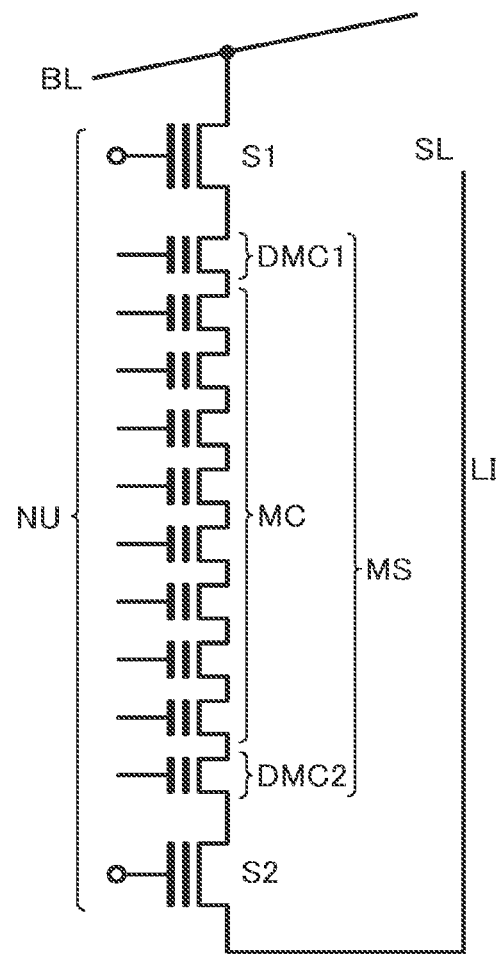
FIG. 3 is an equivalent circuit diagram of one NAND cell unit NU.
Figure 4A:
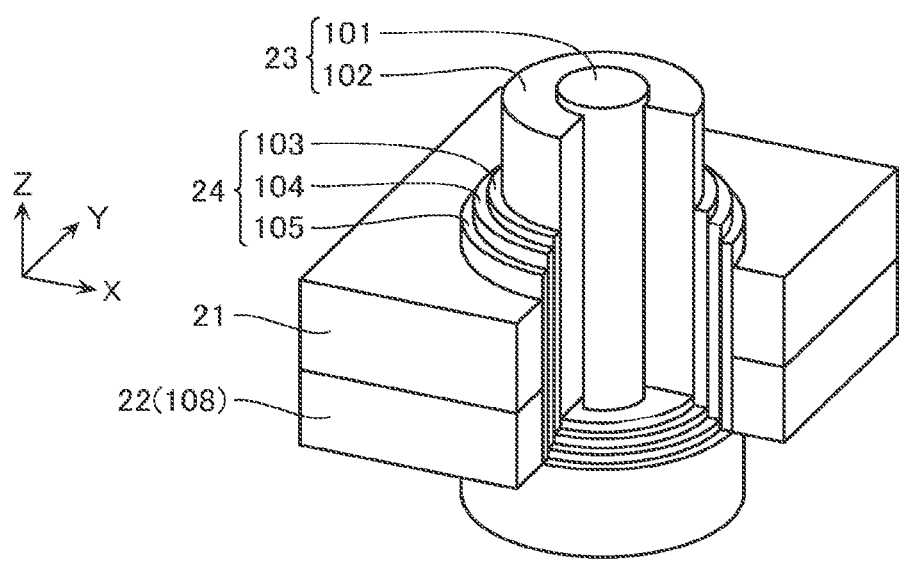
FIG. 4A is a cross-sectional perspective view of one memory cell MC.
Figure 4B:
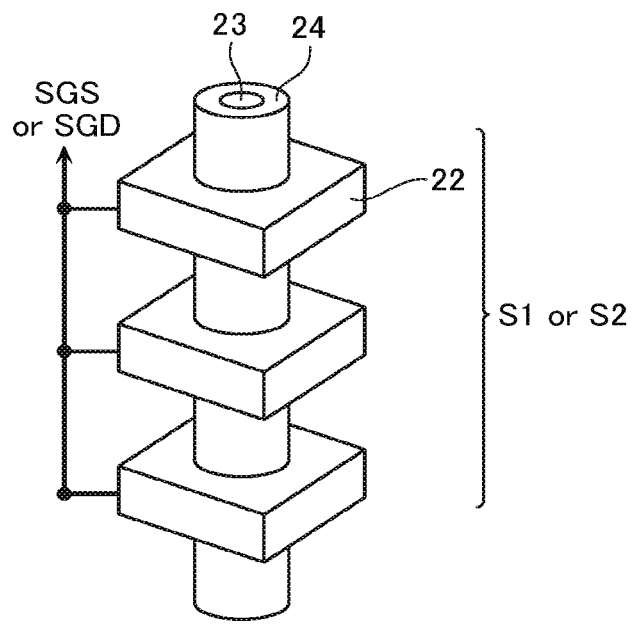
FIG. 4B is a schematic perspective view of one of a drain-side selection transistor S1 and a source-side selection transistor S2.

The following describes the detail of the structure of the memory cell array 11 with reference to FIG. 2 to FIG. 4B. FIG. 2 is a perspective view illustrating the structure of a part of the memory cell array 11. FIG. 3 is an equivalent circuit diagram of one NAND cell unit NU. FIG. 4A is a cross-sectional perspective view of one memory cell MC and similar member. FIG. 4B is a schematic perspective view of one of the drain-side selection transistor S1 and the source-side selection transistor S2.

As illustrated in FIG. 2, the memory cell array 11 has the structure where interlayer insulating films 21 and conducting layers 22 are alternately laminated on a semiconductor substrate SB. This conducting layer 22 functions as the control gate (word line WL) of the memory cell MC, the source-side selection gate line SGS, and the drain-side selection gate line SGD. The interlayer insulating film 21 is disposed in the above-and-below direction of the conducting layer 22 and electrically insulates the conducting layers 22 from one another.

The conducting layer 22 can be formed of, for example, tungsten (W), tungsten nitride (WN), tungsten silicide (WSix), tantalum (Ta), tantalum nitride (TaN), tantalum silicide (TaSix), palladium silicide (PdSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chrome silicide (CrSix), manganese silici de (MnSix), iron silicide (FeSix), ruthenium (Ru), molybdenum (Mo), titanium (Ti), titanium nitride (TiN), vanadium (V), chrome (Cr), manganese (Mn), iron (Fe), cobalt (Co), nickel (Ni), gold (Au), silver (Ag) or copper (Cu), or can be formed of a compound of these materials. The conducting layer 22 may be formed of polysilicon with the addition of impurities.

Semiconductor layers 23 having the longitudinal direction in the lamination direction (the Z direction) and passing through this laminated body of the interlayer insulating film 21 and the conducting layer 22 are disposed at a predetermined pitch in the XY plane. Between: the semiconductor layer 23; and the conducting layer 22 and the interlayer insulating film 21, a memory film 24 including a charge storage layer is formed. As described later, the memory film 24 can be formed by a laminated structure of a charge storage film such as a silicon nitride film, and an oxide film such as a silicon oxide film. Depending on the storage amount of the electric charge to this charge storage film, the threshold voltage of the memory cell MC changes. The memory cell MC holds data corresponding to this threshold voltage.

The semiconductor layers 23 function as the channel regions (body) of the memory cell MC, the dummy cells DMC1 and DMC2, and the selection transistors S1 and S2 that are included in the NAND cell unit NU. These semiconductor layers 23 are coupled, on their upper ends, to the bit lines BL via contacts Cb. The bit lines BL having the longitudinal direction in the Y direction are collocated at a predetermined pitch along the X direction.

The lower end of the semiconductor layer 23 is coupled to the semiconductor substrate SB. Then, the lower end of the semiconductor layer 23 is coupled to the source line SL via this semiconductor substrate SB and a source contact LI, which is described later. The source lines SL are collocated while having their longitudinal directions in the Y direction, similarly to the bit lines BL.

Here, the laminated body of the interlayer insulating film 21 and the conducting layer 22 in the memory cell array 11 is separated by blocks as the smallest unit of data erasure. At the boundary of the separation, a trench Tb is formed. In this trench Tb, an interlayer insulating film (not illustrated) is implanted. Further, the source contact LI described above is formed passing through the interlayer insulating film. This source contact LI has a lower end coupled to the semiconductor substrate SB while having an upper end coupled to the source line SL.

FIG. 3 is an equivalent circuit diagram of one NAND cell unit NU. In this memory cell array 11, the one NAND cell unit includes the memory string MS, the drain-side selection transistor S1, and the source-side selection transistor S2. The memory string MS is constituted of a plurality of the memory cells MC and dummy cells DMC1 and DMC2. The drain-side selection transistor S1 is coupled between the upper end of the memory string MS and the bit line BL. The source-side selection transistor S2 is coupled between the lower end of the memory string MS and the source line SL.

FIG. 4A illustrates one example of a specific structure of one of the memory cell MC and the dummy cell DMC. The semiconductor layer 23 includes an oxide-film core 101 and a semiconductor columnar portion 102, which surrounds the peripheral area of the oxide-film core 101. The oxide-film core 101 is formed of, for example, a silicon oxide film ($SiO_2$). The semiconductor columnar portion 102 is formed of, for example, silicon (Si), silicon-germanium (SiGe), silicon carbide (SiC), germanium (Ge), or carbon (C).

In the peripheral area of this semiconductor columnar portion 102, the memory film 24 is formed to surround the semiconductor columnar portion 102. The memory film 24 includes a tunnel insulating film 103, a charge storage layer 104, and a block insulating film 105. The tunnel insulating film 103 is constituted of, for example, a silicon oxide film (SiOx), and functions as the tunnel insulating film of the memory cell MC or the dummy cell DMC. The charge storage layer 104 is constituted of, for example, a silicon nitride film (SiN), and has a function that traps electrons injected from the semiconductor columnar portion 102 via, the tunnel insulating film 103 by a write operation. The block insulating film 105 can be formed of, for example, a silicon oxide film. In this example, the tunnel insulating film 103, the charge storage layer 104, and the block insulating film 105 are illustrated to be formed in the whole region of the side surface of the semiconductor columnar portion 102. This, however, should not be construed in a limiting sense. These members can be formed only on the side surface of the word line WL. The memory film 24 illustrated in FIG. 4A has a three-layered structure, but can employ various materials, laminated structures, and similar parameter. The memory film 24 is not limited to the configuration in FIG. 4A or the material described above. However, at a minimum, the charge storage layer is included to provide the function as a memory film.

Here, the materials of the tunnel insulating film 103 and the block insulating film 105 can employ, for example, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, and AlSiO other than the silicon oxide film (SiOx).

FIG. 4B is a perspective view illustrating the structure of one of the drain-side selection transistor S1 and the source-side selection transistor S2. One of the drain-side selection transistor S1 and the source-side selection transistor S2 is constituted of: a plurality of the conducting layers 22; and the memory film 24 and the semiconductor layer 23 that are adjacent to these layers in the XY plane. The plurality of the conducting layers 22 coupled to one of the selection transistors S1 and S2 are electrically coupled together by a contact conductive film (not illustrated in FIG. 4B) formed on the sidewall of a plurality of conductive films as described later, and function as a single gate electrode. As just described, one of the selection transistors S1 and S2 according to this first embodiment includes the plurality of the conducting layers 22 coupled together. This configuration is employed to enhance the selection characteristics of the selection transistor S1 or S2. That is, in the non-selected selection transistors S1 and S2, it is necessary to reduce the leak current as much as possible. Otherwise, it is impossible to appropriately perform a read operation, a write operation and an erase operation, and this might cause a read error, a write error, an erase error, and similar error. This also increases the power consumption. One of the selection transistors S1 and S2 has the plurality of the conducting layers 22 as the gate electrode so as to improve the selectivity of the selection transistor.

Figure 5:
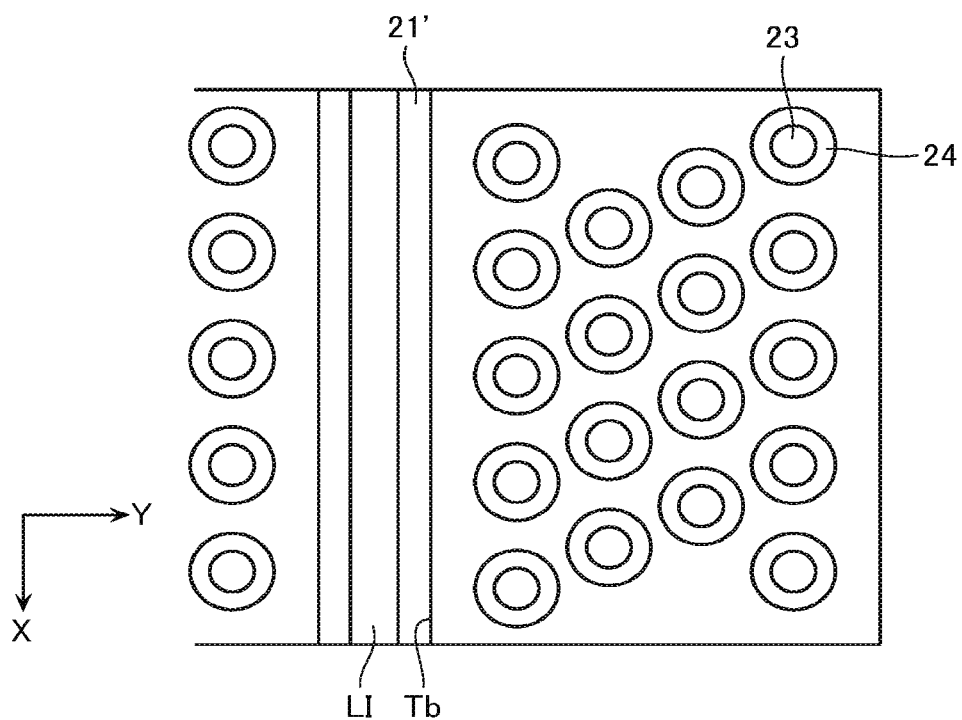
FIG. 5 is a plan view of a part of the memory cell array 11.
Figure 6A:
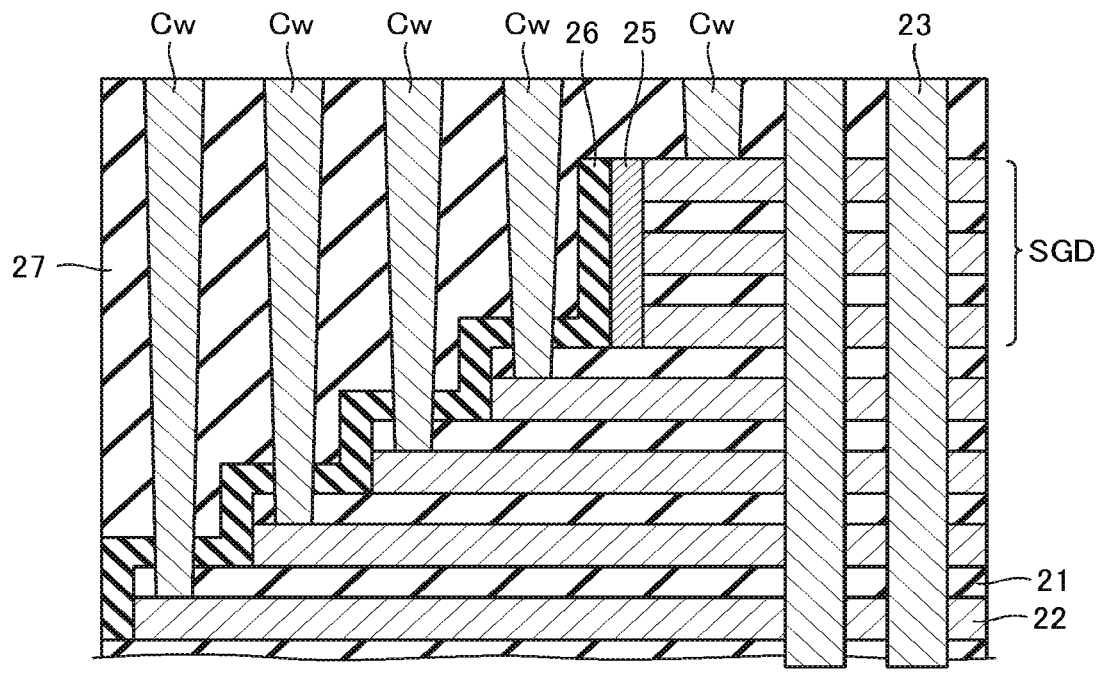
FIGS. 6A and 6B are a partial cross-sectional view and a plan view of one configuration example of a wiring portion 20.
Figure 6B:
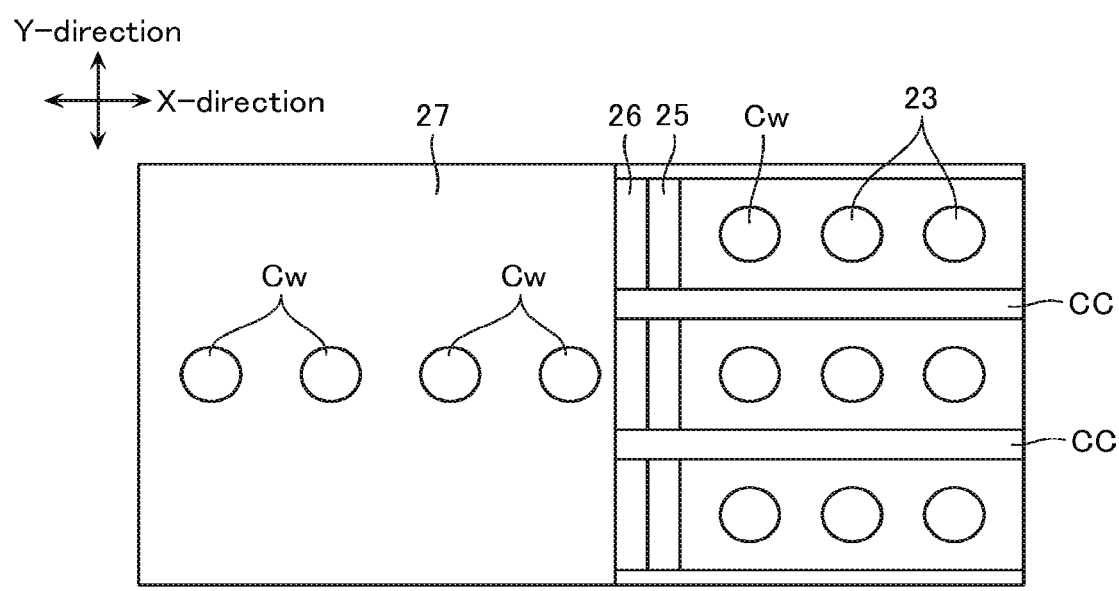

The following describes the structures of the memory cell array 11 and the wiring portion 20 further in detail with reference to FIG. 5 to FIG. 6B. FIG. 5 is a plan view of a part of the memory cell array 11. FIGS. 6A and 6B are a partial cross-sectional view and a plan view of the wiring portion 20.

As illustrated in FIG. 5, the semiconductor layers 23 (the semiconductor columnar portion 102) are arrayed in one row in the oblique direction with respect to the X direction (the word-line direction) and the Y direction (the bit-line direction). This increases the array density of the semiconductor layer 23, thus increasing the array density of the memory cell MC. However, this is only one example, and the semiconductor layers 23 can be disposed along the X direction and the Y direction. The source contact LI is formed in a stripe shape to have the longitudinal direction in the X direction, and is implanted in the trench Tb via an interlayer insulating film 21'.

This source contact LI is implanted in the trench Tb, which divides the memory cell array 11 by blocks, via the interlayer insulating film 21'. The source contact LI has the lower end in contact with the diffusion layer, which is formed on the surface of the substrate SB, and has the upper end coupled to the source line SL via upper-layer wiring.

The following describes the structure of the wiring portion 20 with reference to FIG. 6A and FIG. 6B. FIG. 6A is a partial cross-sectional view of the wiring portion 20, and FIG. 6B is a plan view of the wiring portion 20. As described above, the wiring portion 20 is a wiring portion for coupling the conducting layer 22, which functions as the word line WL or the selection gate line SGD or SGS (SGD is illustrated alone in FIG. 6A), to an external circuit via a contact. Here, in FIG. 6A, the drain-side selection gate line SGD is described as an example. The illustrations of the substrate SB and the source-side selection gate lines SGS arranged at the substrate SB side are omitted. The same applies to the other drawings after FIG. 6A.

The conducting layers 22 that function as the word lines WL are processed in a staircase pattern together with the interlayer insulating films 21 in this wiring portion 20. Accordingly, the respective upper portions of the word lines WL can be independently coupled to contacts Cw. The conducting layers 22 that function as the word lines WL are coupled to the word-line driving circuit 12 illustrated in FIG. 1 by the contacts Cw. Here, while not illustrated in FIGS. 6A and 6B, the contact Cw is implanted in a trench formed in an insulating film 27 that fills the wiring portion 20, via an insulating film (not illustrated).

On the other hand, the conducting layers 22 that function as the drain-side selection gate line SGD are processed not in a staircase pattern, but such that their end portions have the identical length in the X direction (the longitudinal direction of the selection gate line) as illustrated in FIGS. 6A and 6B. The selection gate line SGD coupled to one drain-side selection transistor S1 includes a plurality of the conducting layers 22 (the first conducting layers) where their end portions having the identical length described above are electrically coupled in common to a conducting layer 25 (the second conducting layer), which is formed in these end portions. The conducting layer 25 in the end portion of the selection gate line is arranged to electrically couple the plurality of the conducting layers 22 in common, so as to obtain a selection transistor with preferable selection characteristics compared with the selection transistor having a single conducting layer as a gate electrode.

While not illustrated, the conducting layers 22 that function as the source-side selection gate line SGS, which is formed in the lower portion of the laminated body, are also formed similarly to the drain-side selection gate line SGD. The end portions of the conducting layers 22 are processed to be aligned in the longitudinal direction. The selection gate line SGS coupled to one source-side selection transistor S2 includes a plurality of the conducting layers 22 (the first conducting layers) electrically coupled in common to a conducting layer (the second conducting layer) arranged in these end portions, similarly to the drain-side selection gate line SGD.

Here, as described in detail later, the conducting layer 22 can be formed by removing a sacrifice film by wet etching and then filling a conductive material in the void from which the sacrifice film has been removed. In the case where this wet etching is performed, the wiring portion 20 includes slit portions CC arranged at predetermined intervals as illustrated in FIG. 6B. The sacrifice film is removed by a wet etching solution entering from this slit portion CC. Via the gap remaining after removing the sacrifice film in the slit portion CC, the conducting layer 22 described above is formed as a film using a CVD method or similar method. After the conducting layer 22 is formed as a film, an insulating film is filled in the slit portion CC.

As apparent from this description, the removal of the sacrifice film and the film formation of the conducting layer 22 are performed by pouring the materials in the Y direction using the slit CC. On the other hand, the conducting layer 25 is formed in the end portions of the conducting layers 22 in the X direction. This does not affect the pouring of the materials in the Y direction at the time of the removal of the sacrifice film and the film formation of the conducting layer. Additionally, because the conducting layer 25 is formed from the material different from that of the sacrifice film 22', the conducting layer 25 is not removed simultaneously when a sacrifice film 22' is removed. Therefore, the conducting layer 25 can be formed as a film at any timing before the sacrifice film is removed, after the sacrifice film is removed and the conducting layer 22 is formed as a film, or similar timing.

Figure 7:
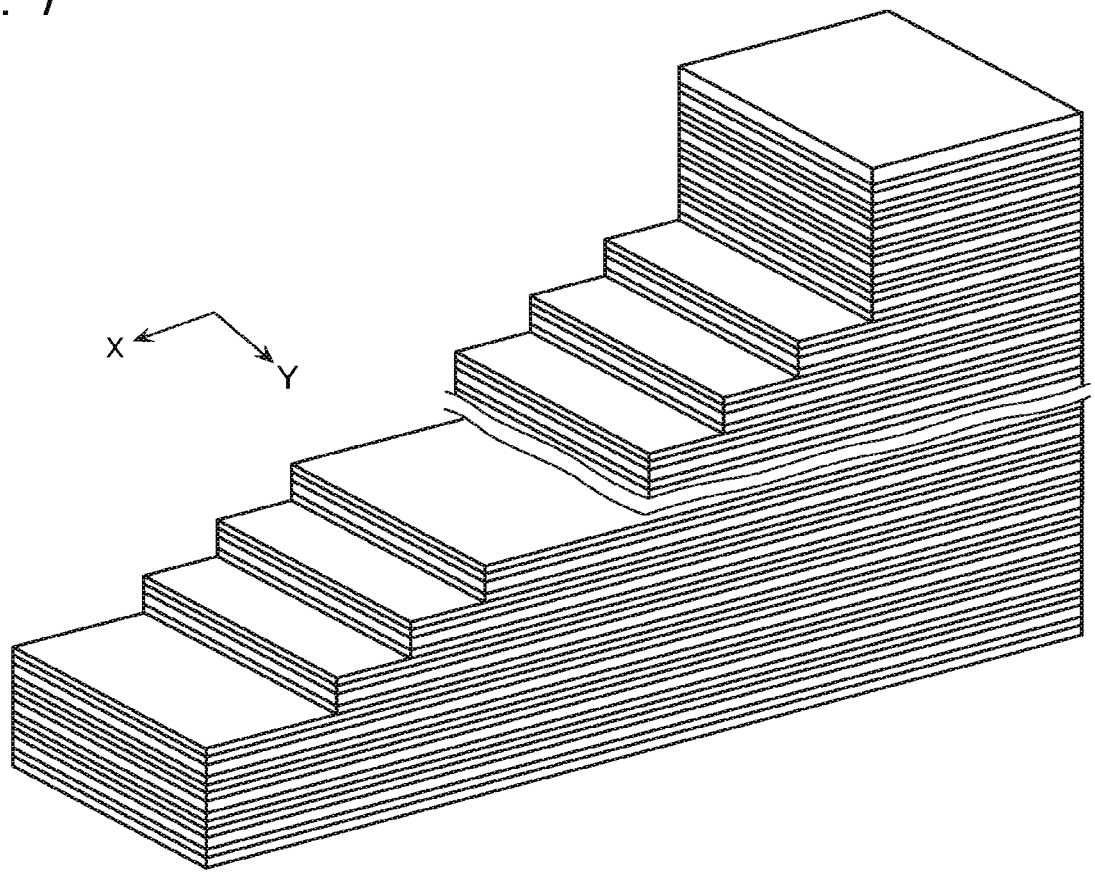
FIG. 7 is a schematic perspective view illustrating one example of the configuration of the wiring portion 20.
Figure 8:
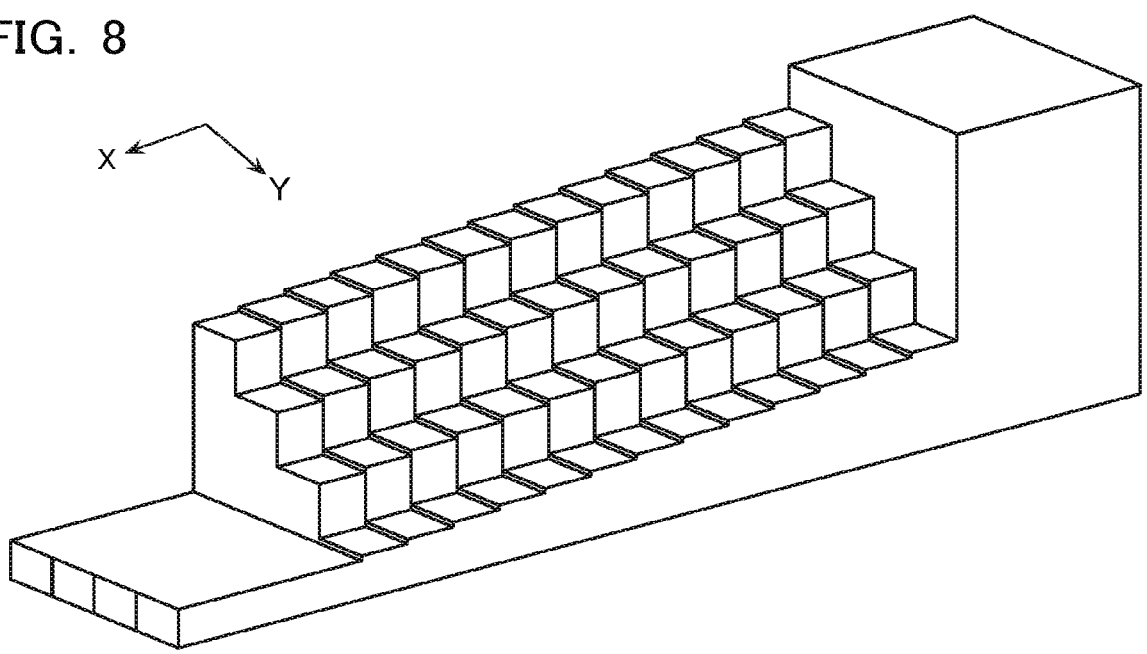
FIG. 8 is a schematic perspective view illustrating another example of the configuration of the wiring portion 20.

Here, the conducting layer 22 constituting the word line WL may be a staircase portion that one-dimensionally expands only in the X direction as illustrated in FIG. 7 or may be a staircase portion that two-dimensionally expands in both the X direction and the Y direction as illustrated in FIG. 8.

[Method of Manufacturing Wiring Portion 20]

Next, a description will be given of a method of manufacturing the wiring portion 20 with reference to FIG. 9 to FIG. 14B.

Figure 9:
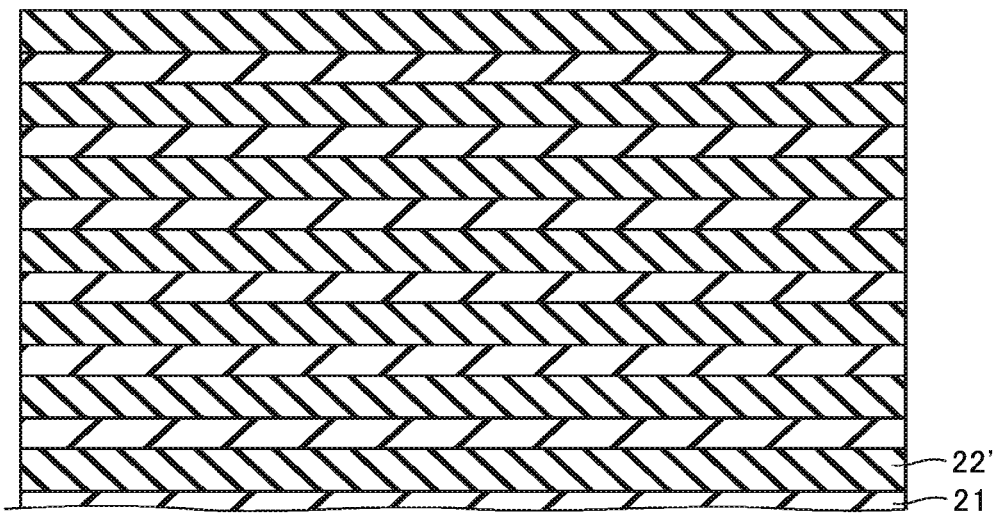
FIG. 9 is a process diagram illustrating a method of manufacturing the memory cell array 11 and the wiring portion 20.
Figure 10:
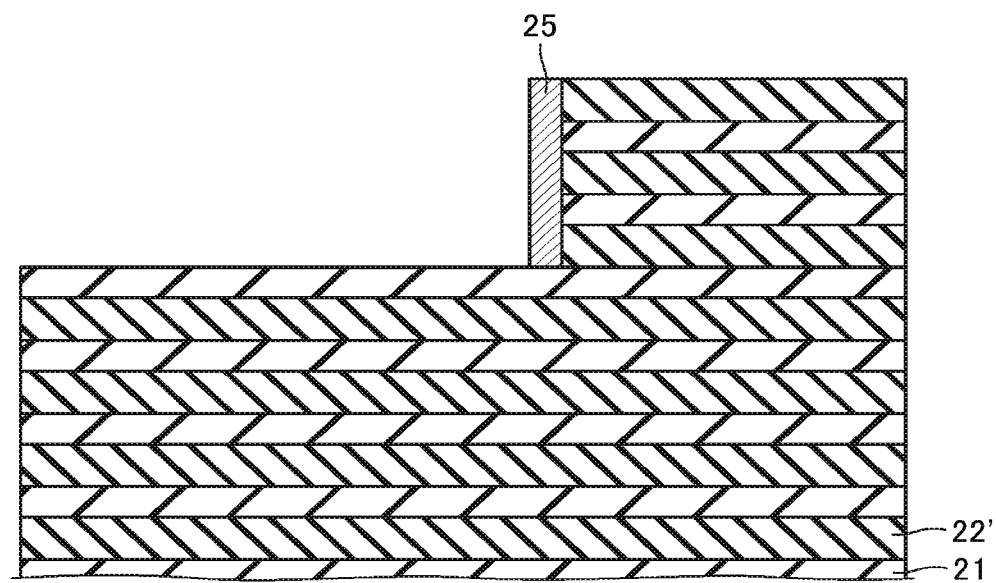
FIGS. 10 to 14B are process diagrams illustrating the method of manufacturing the memory cell array 11 and the wiring portion 20.
Figure 11:
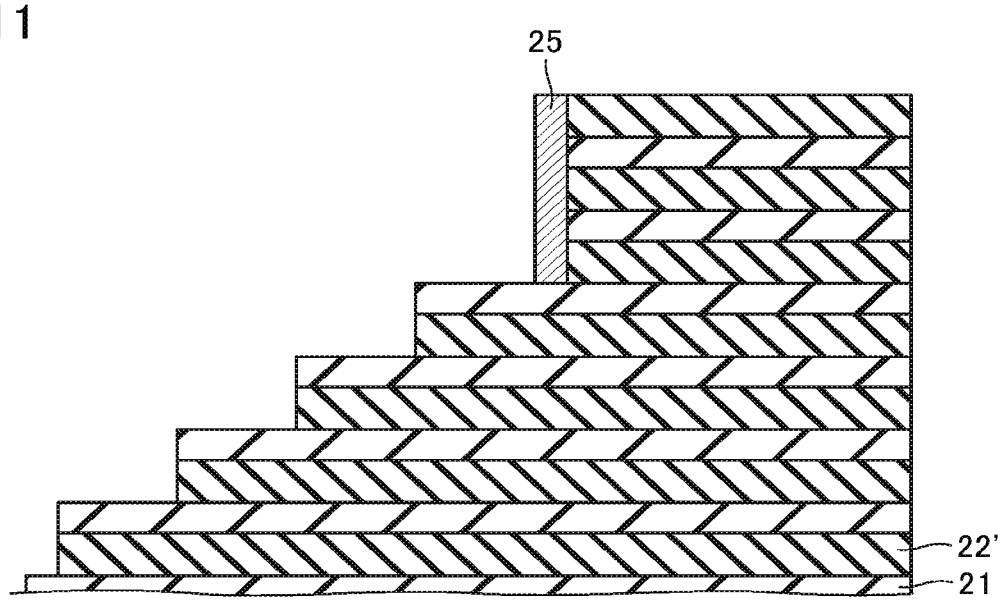
Figure 12:
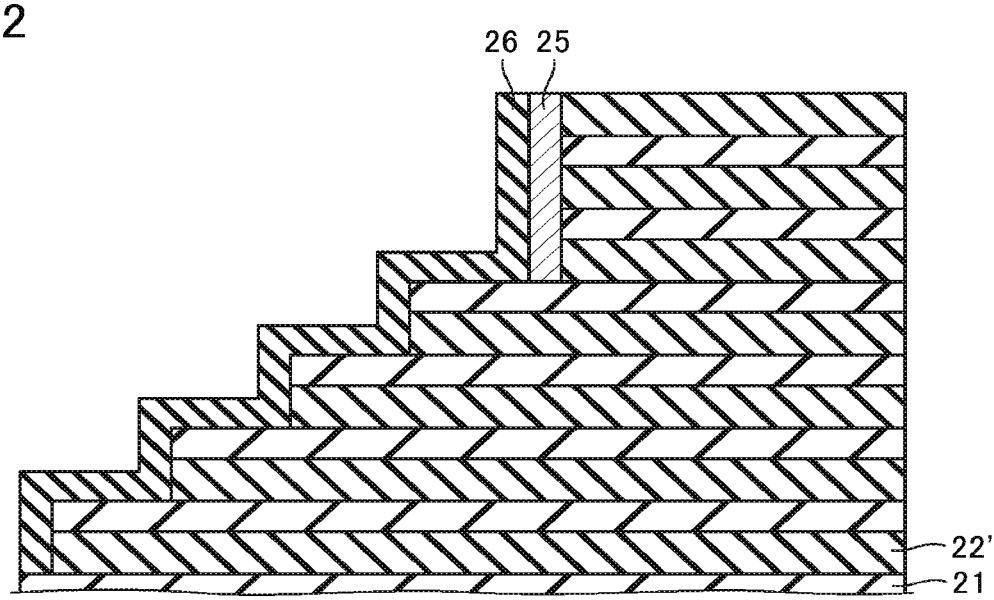
Figure 13:
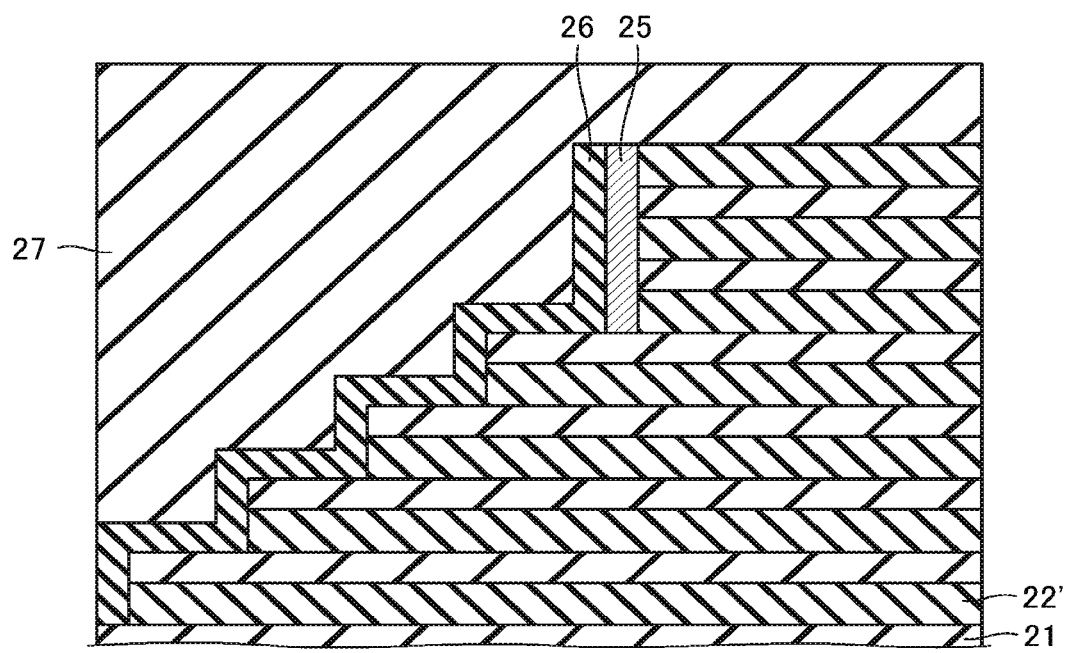
Figure 14A:
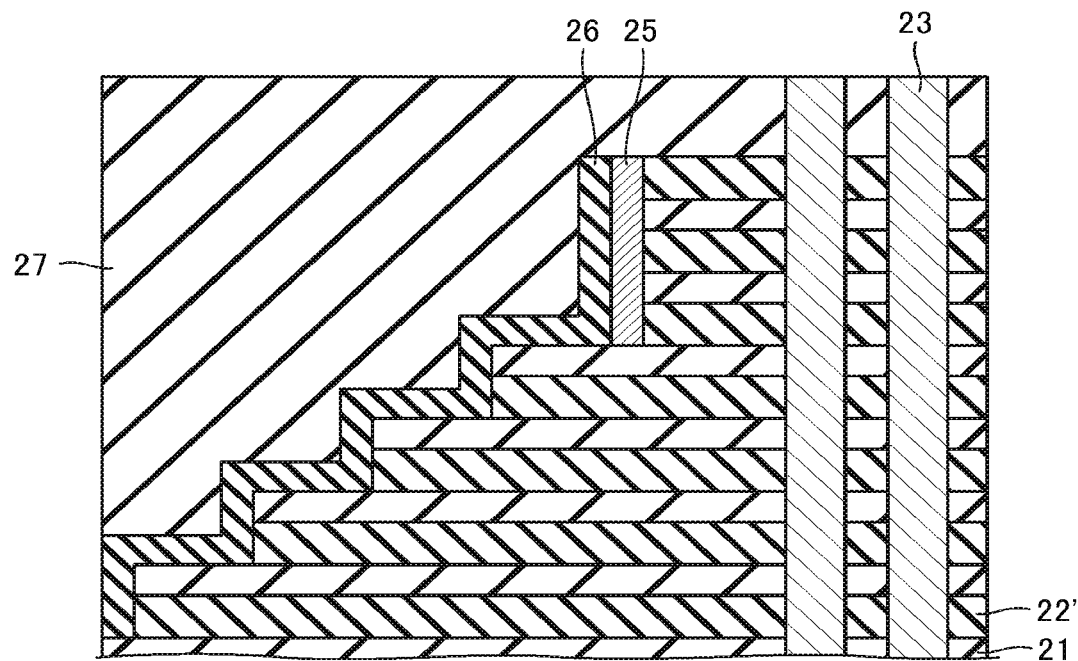
Figure 14B:
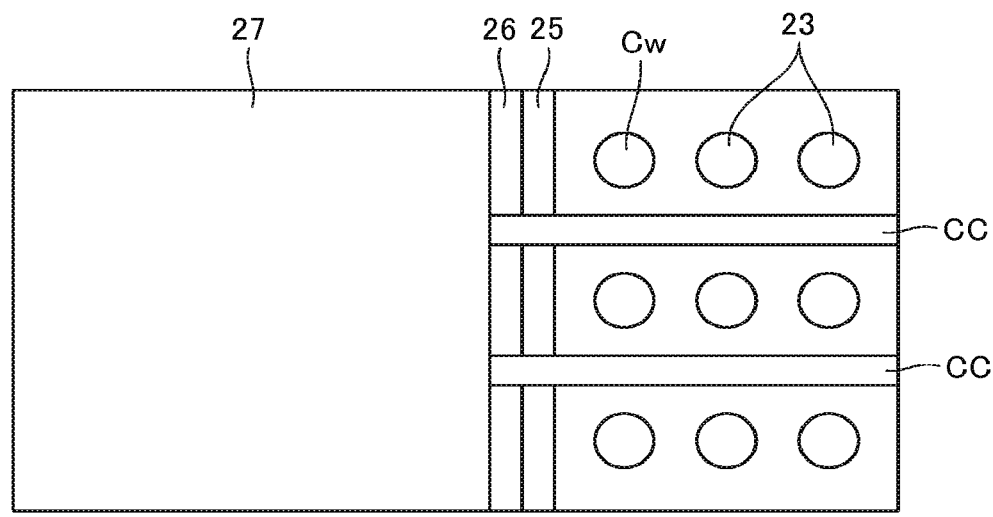

Firstly, as illustrated, in FIG. 9, on the substrate SB made of silicon or similar material, a plurality of the sacrifice films 22' made of, for example, silicon nitride films and a plurality of the interlayer insulating films 21 made of, for example, silicon oxide films are laminated so as to form a laminated body. Then, as illustrated in FIG. 10, a part of the upper portion of the laminated body is removed by photolithography and dry etching as a whole. On the sidewall, that is, in the end portion of the portion where the laminated body is removed, the drain-side selection gate line SGD is formed. Then, to ensure the contact, that is, the electrical coupling between these plurality of the conducting layers, the conducting layer 25 made of, for example, silicon doped with B is formed as a film on the sidewall of the drain-side selection gate line SGD. This conducting layer 25 electrically couples the plurality of the laminated conducting layers 22 of the drain-side selection gate line SGD to one another. Subsequently, as illustrated in FIG. 11, the laminated films under the drain-side selection gate line SGD are processed in a staircase pattern by photolithography and etching again. Then, as illustrated in FIG. 12, for example, an insulating layer 26 made of alumina or similar material is deposited as a stopper material at the time of the subsequent formation of the contacts Cw. Subsequently, as illustrated in FIG. 13, the insulating film 27 for protecting the upper portion of the drain-side selection gate line SGD is deposited. Then, as illustrated in FIG. 14A and FIG. 14B, memory holes are formed by photolithography and etching to form memory layers (not illustrated) including charge storage layers. Silicon to be channels is deposited to form the semiconductor layers 23 in columnar shapes. Lastly, the contacts Cw are formed and, additionally, the sacrifice films 22' are replaced by metal films made of, for example, tungsten so as to obtain the configurations in FIGS. 4A and 4B.

Here, a description is given of the case where the sacrifice films 22' are replaced by the conducting layers 22 as the metal films above. However, for example, it is possible to laminate the conducting layers, which are made of silicon doped with impurities or similar aterial, and the interlayer insulating films from the start, so as to form the laminated body without replacement.

The insulating layer 26 can employ various materials such as silicon nitride other than alumina described above.

(Effects)

According to the first embodiment described above, the plurality of the conducting layers 22 of the selection gate line are electrically coupled in common to the conducting layer 25, which is arranged in their end portions. This allows obtaining a nonvolatile semiconductor memory device in a three-dimensional structure having a selection transistor with high selectivity.

Second Embodiment

Figure 15A:
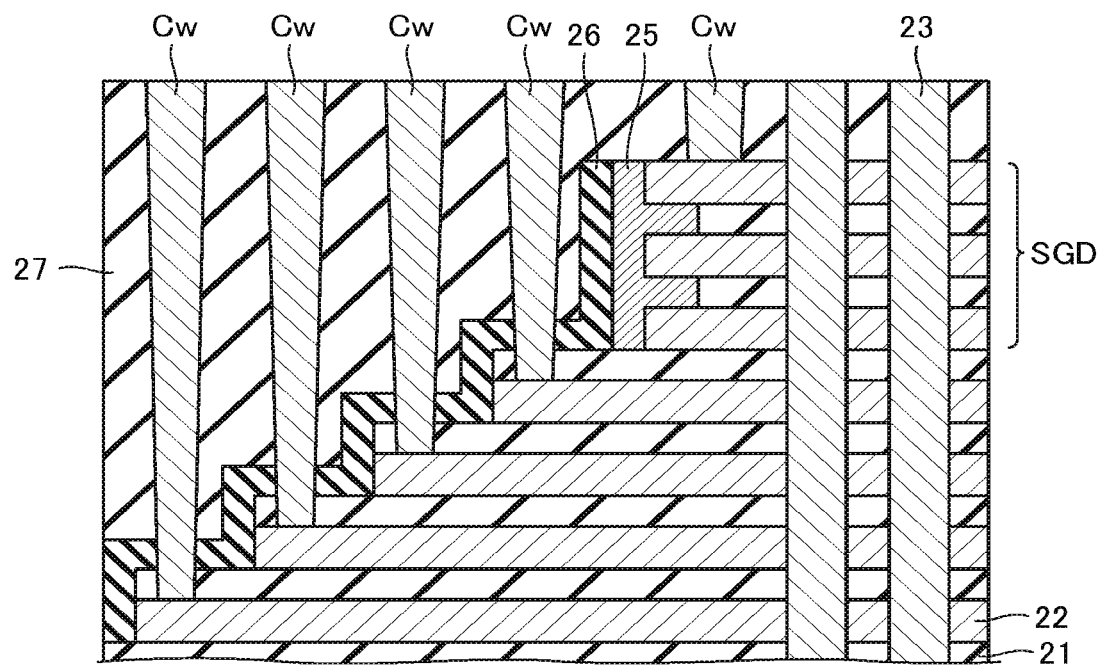
FIGS. 15A to 15C are a partial cross-sectional view and a plan view illustrating the configuration of the wiring portion 20 of a nonvolatile semiconductor memory device according to a second embodiment.
Figure 15B:
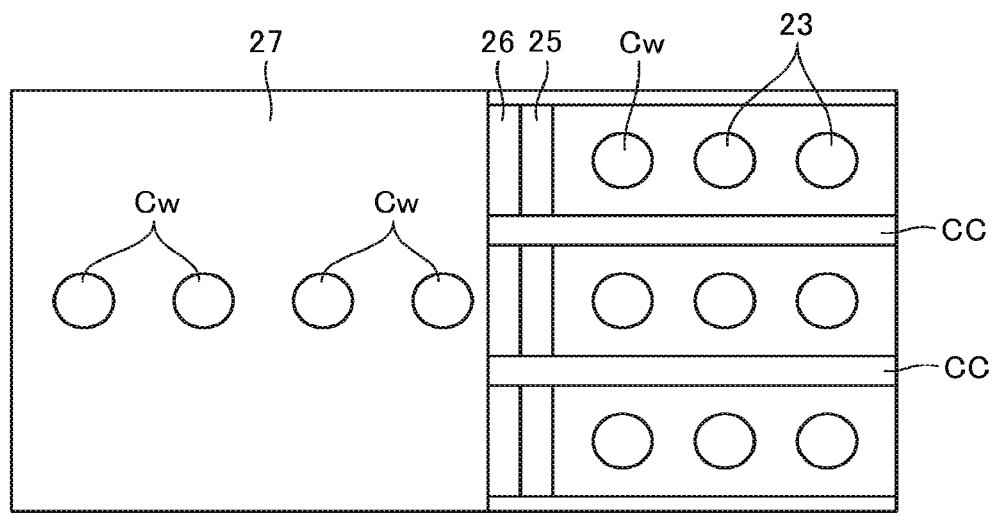
Figure 15C:
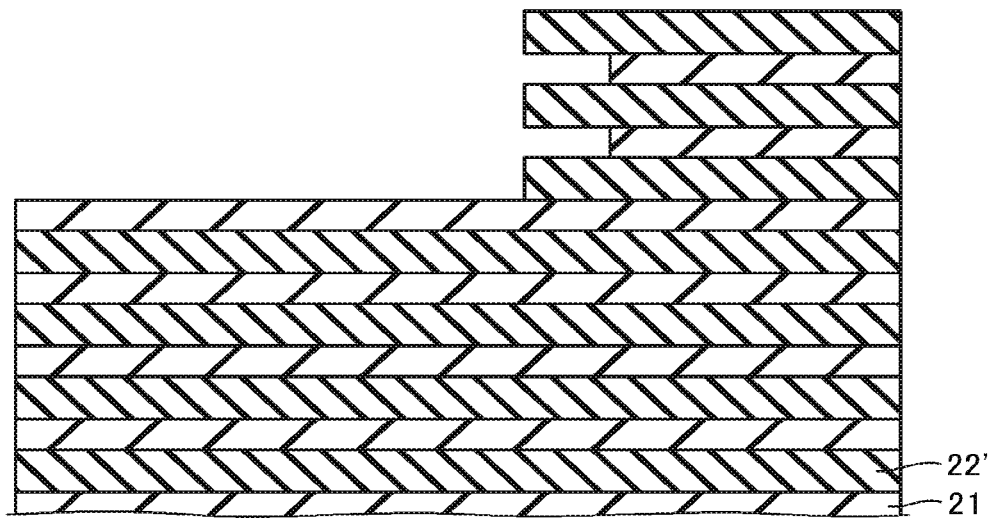

The following describes a nonvolatile semiconductor memory device according to a second embodiment with reference to FIGS. 15A to 15C. The overall configuration of this second embodiment is approximately identical to that of the first embodiment (in FIG. 1 to FIG. 6B). However, this second embodiment differs from the first embodiment in the structure of the end portion of the selection gate line and the configuration of the conducting layer 25 (the second conducting layer).

FIG. 15A is a partial cross-sectional view of the wiring portion 20 of the nonvolatile semiconductor memory device portion 20 of the nonvolatile semiconductor memory device according to the second embodiment. FIG. 15B is a plan view of the wiring portion 20.

Regarding the wiring portion 20 illustrated in FIG. 15A and FIG. 15B, in the end portion of the drain-side selection gate line SGD, the end portions of the interlayer insulating films 21 retreat in the inward direction of the drain-side selection gate line SGD compared with the end portions of the conducting layers 22. In other words, the end portions of the conducting layers 22 project in the longitudinal direction compared with the end portions of the interlayer insulating films 21. The conducting layer 25 formed on the sidewall of the drain-side selection gate line SGD is formed extending into the voids caused by retreating of the interlayer insulating films 21.

The method of manufacturing the wiring portion 20 according to the second embodiment is approximately identical to the manufacturing method used in the first embodiment, but is differs from the first embodiment in the phase of forming the conducting layer 25 described using FIG. 10 in the first embodiment. That is, in the second embodiment, as illustrated in FIG. 15C, wet etching using a chemical liquid is performed on the end portion of the laminated body to be the drain-side selection gate line SGD before the conducting layer 25 is formed, so as to retreat the interlayer insulating films 21. Then, after the sacrifice films 22' are replaced by metal films made of, for example, tungsten as the conducting layers 22, the conducting layer 25 is formed on the sidewall of the drain-side selection gate line SGD to be present also in the void portion caused by retreating of the interlayer insulating films 21. In other words, the end portions of the interlayer insulating films 21 are etched so as to cause the voids between the end portions of the conducting layers 22. Accordingly, the conducting layer 25 is formed not only on the sidewalls of the conducting layers 22, but also inside these voids. The subsequent processes are similar to those in the first embodiment, and the configuration in FIG. 15A is thus obtained.

(Effects)

This second embodiment also allows providing effects identical to those in the first embodiment. Furthermore, in this second embodiment, the conducting layer is formed extending to the inner side of the end portion of the selection gate. This further increases the contacted area between the conducting layer and the conducting layers of the selection gate, thus reducing the resistance. This consequently provides preferable current characteristics, thus realizing excellent cell characteristics.

[Modification]

A description will be given of other examples of the wiring portion with reference to FIGS. 16 to 19.

In the first and second embodiments, the plurality of the conducting layers 22 of the selection gate line are coupled in common to one conducting layer 25, which is formed in the end portion of the selection gate line aligned in the longitudinal direction. However, like FIG. 16, it is also possible to: form the selection gate line portion, for example, in a staircase pattern for each of two layers whose end portions are aligned in the longitudinal direction; and form the conducting layers 25 in the end portions for each of the two layers aligned in the longitudinal direction so as to ensure electrical coupling. In other words, the plurality of the conducting layers 22 are formed as the staircase structure, and the conducting layers 22 having the identical steps are electrically coupled in common to the conducting layer 25. With this configuration, the portions that are not aligned in the longitudinal direction are electrically independent from one another. Accordingly, it is possible to employ various usages, for example, a method for applying different electric potentials to the respective portions.

Figure 16:
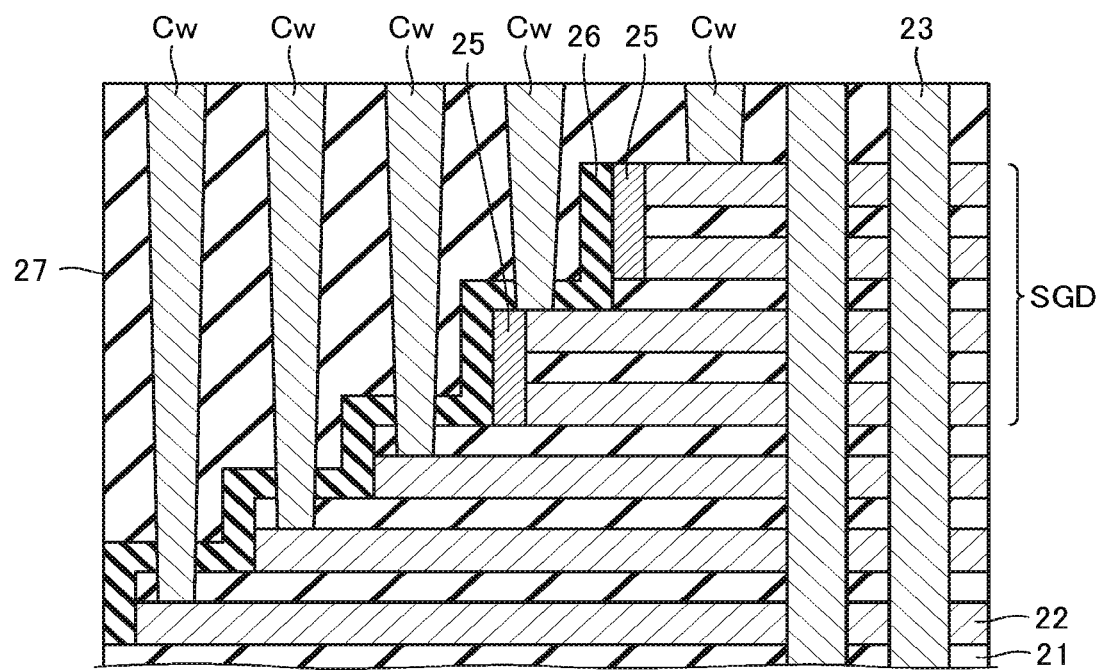
FIGS. 16 to 19 illustrate a modification.
Figure 17:
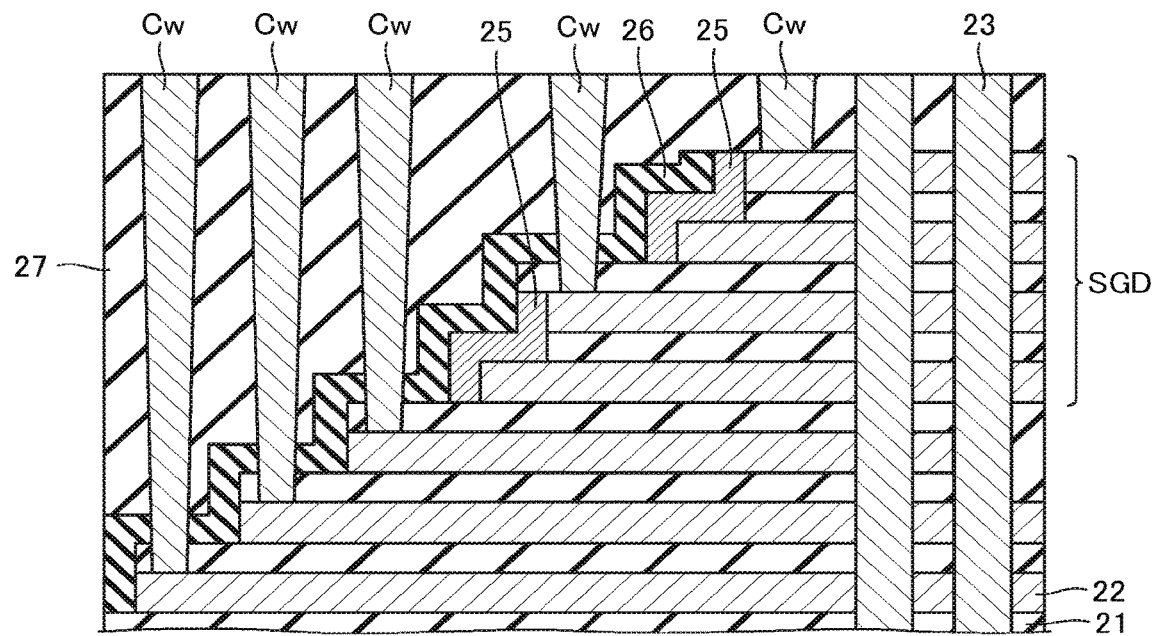

In FIG. 16, the plurality of the conducting layers 22 electrically coupled in common to the conducting layer 25 are aligned in the longitudinal direction. However, as illustrated in FIG. 17, the plurality of the conducting layers 22 can have the end portions having mutually different lengths, and a plurality of the conducting layers 22 having mutually different lengths can be electrically coupled in common to the conducting layer 25 (in the example of FIG. 17, the conducting layers having different lengths are electrically coupled in common for each of two layers).

Figure 18:
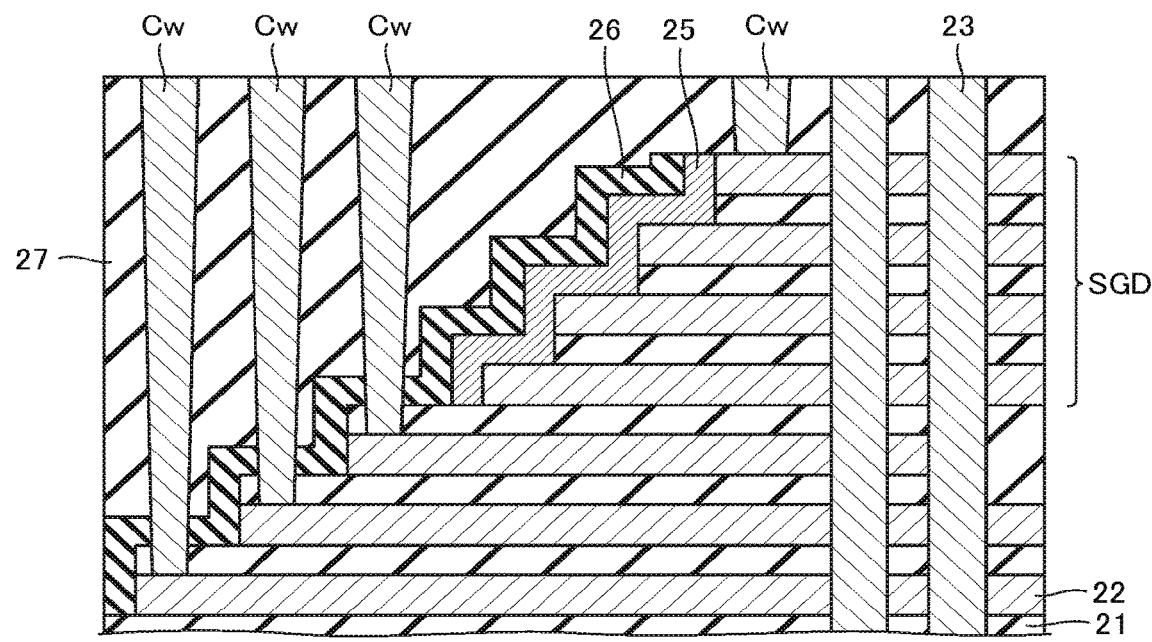

As illustrated in FIG. 18, it is possible to employ the configuration where the plurality of the conducting layers 22 are formed as the staircase structure, one conducting layer 25 is formed in the end portion of this staircase pattern, and all the plurality of the conducting layers 22 as the staircase pattern are electrically coupled in common.

Figure 19:
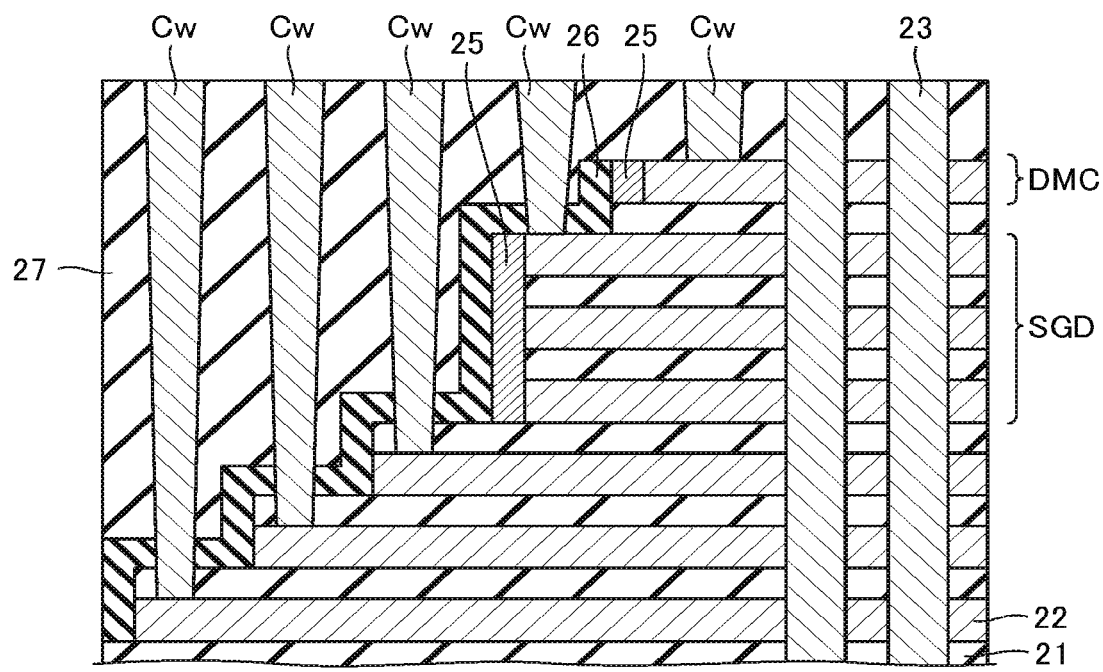

In the above-described embodiments and modification, a description is given of the case where all the conducting layers 22 function as the gate electrodes of the selection gate lines. However, as illustrated in FIG. 19, a part of the conducting layers 22 can also be used as the dummy cells DMC without being used as the gate electrodes. Here, in FIG. 19, the conducting layer 22 as the dummy cell DMC is one layer. In this case, the conducting layer 25 is not necessarily needed.

As apparent from the first and second embodiments and the modification described above, it is possible to employ various shapes of the conducting layer 22 constituting the selection gate line and various arrangement methods of the conducting layer 25 arranged in the end portion of the selection gate line, depending on the usage or similar condition. In the drawings used in the above description, there are always four layers of the conducting layers 22 and there are one or two layers of the conducting layers 25. Obviously, the number of laminations of the conducting layers 22 and the number of the conducting layers 25 are not limited to these.

(Effects)

The above-described nonvolatile semiconductor memory device according to the modification can also provide effects similar to those in the first and second embodiments that have been described.

[Charge Storage Layer 104]

As the material of the charge storage layer 104, the silicon nitride film (SiN) is described in the above-described embodiment as an example. However, the following oxides can also be selected.

$SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, and AlSiO $AB_2O_4$ (However, A and B are identical or different elements, and, are one of Al, Sc, Ti, V, Cr, Mn, Fe, Co, Ni, Cu, Zn, Ga, and Ge. For example, $Fe_3O_4$, $FeAl_2O_4$, $Mn_{1+x}Al_{2-x}O_{4+y}$, $Co_{1+x}Al_{2-x}O_{+y}$, and MnOx are employed.)

$ABO_3$ (However, A and B are identical or different elements, and, are one of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn. For example, LaAlO$_3$, SrHfO$_3$, SrZrO$_3$, and SrTiO$_3$ are employed.)

As the material of the charge storage layer 104, the following oxynitrides can also be selected.

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, and AlSiON Further, it is also possible to employ the materials obtained by replacing a part of the oxygen elements of the oxides described above by nitrogen elements. In particular, one insulating layer and a plurality of insulating layers are each preferred to be selected from the group consisting of SiO$_2$, SiN, Si$_3$N$_4$, Al$_2$O$_3$, SiON, HfO$_2$, HfSiON, Ta$_2$O$_5$, TiO$_2$, and SrTiO$_3$.

In particular, regarding silicon-based insulating films such as SiO$_2$, SiN, and SiON, the respective concentrations of the oxygen elements and the nitrogen elements can be set to be equal to or more than $1 \times 10^{18}$ atoms/cm$^3$. However, the barrier heights of the plurality of insulating layers are different from one another. The insulating layer can include a material including impurity atoms that forms a detect level or semiconductor/metal dots (the quantum dots).

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a substrate,
    a stack including a plurality of word line electrodes separated from each other in a first direction perpendicular to the substrate, and a plurality of first selection gate electrodes provided above an upper most electrode among the plurality of word line electrodes and having respective first end surfaces separated from each other in the first direction;
    a semiconductor columnar portion that extends through the plurality of first selection gate electrodes and the plurality of word line electrodes in the first direction;
    a memory film provided between the semiconductor columnar portion and the plurality of word line electrodes;
    a first conducting layer having portions provided in a second direction parallel to the substrate, said portions extending in the first direction and being in conductive contact with the respective first end surfaces of the plurality of first selection gate electrodes separated from each other in the first direction; and
    a contact provided at one end of the stack in the second direction and provided on one of the plurality of word line electrodes.

2. The nonvolatile semiconductor memory device according to claim 1, wherein
    the plurality of first selection gate electrodes have end portions aligned in the second direction, and
    the first conducting layer connects to the end portions of the plurality of first selection gate electrodes and extends in the first direction.

3. The nonvolatile semiconductor memory device according to claim 1, wherein
    the plurality of first selection gate electrodes have end portions which are formed a staircase structure, and
    the first conducting layer forms a staircase structure that fits the end portions of the plurality of first selection gate electrodes.

4. The nonvolatile semiconductor memory device according to claim 3, wherein
    the stack further includes a second conductive layer, the first conductive layer is in contact with a part of the plurality of first selection gate electrodes and the second conductive layer is in contact with another part of the plurality of first selection gate electrodes.

5. The nonvolatile semiconductor memory device according to claim 1, wherein
    the stack further includes a plurality of second selection gate electrodes separated from each other in the first direction and provided between a lowermost electrode of the plurality of first selection gate electrodes and the upper most electrode of the plurality of word line electrodes,
    the memory device further comprising a second conducting layer provided at the first end of the stack and directly in contact with each of the plurality of second selection gate electrodes,
    one of the plurality of first selection gate electrodes has a different length from one of the plurality of second selection gate electrodes in the second direction, and
    the plurality of first selection gate electrodes are electrically independent from the plurality of second selection gate electrodes.

6. The nonvolatile semiconductor memory device according to claim 1, further comprising:
    a plurality of interlayer insulating films stacked alternately with the plurality of first selection gate electrodes in the first direction, wherein
    the plurality of first selection gate electrodes have end portions projecting in the second direction with respect to end portions of the interlayer insulating films, and
    the first conducting layer extends from the end portions of the plurality of first selection gate electrodes to end portions in the second direction of the interlayer insulating films.

7. The nonvolatile semiconductor memory device according to claim 1, further comprising:
    at least one electrode provided above an upper most first selection gate electrode among the plurality of first selection gate electrodes and being not connected to the plurality of first selection gate electrodes.

8. The nonvolatile semiconductor memory device according to claim 1, wherein
    the plurality of first selection gate electrodes and the first conducting layer are made of mutually different materials.

9. The nonvolatile semiconductor memory device according to claim 1, wherein
    the first conducting layer is formed of polysilicon with the addition of impurities.

* * * * *